United States Patent [19]

Satoh et al.

[11] Patent Number: 4,880,613

[45] Date of Patent: Nov. 14, 1989

[54] LIGHT EMITTING ELEMENT COMPRISING DIAMOND AND METHOD FOR PRODUCING THE SAME

[75] Inventors: Shyuichi Satoh; Kazuwo Tsuji, both of Itami, Japan

[73] Assignee: Sumitomo Electric Industries, Ltd., Osaka, Japan

[21] Appl. No.: 143,114

[22] Filed: Jan. 12, 1988

[30] Foreign Application Priority Data

Jan. 12, 1987 [JP] Japan ............................. 62-5730
Jul. 15, 1987 [JP] Japan ........................... 62-176825
Oct. 29, 1987 [JP] Japan ........................... 62-274494

[51] Int. Cl.⁴ ......................................... B01J 3/08
[52] U.S. Cl. ........................... 423/446; 156/DIG. 8; 156/DIG. 68; 252/301.4 F; 372/41; 372/42
[58] Field of Search .............. 423/446; 156/DIG. 68, 156/DIG. 8; 252/301.4 F; 372/41, 42

[56] References Cited

U.S. PATENT DOCUMENTS

| | | | |
|---|---|---|---|
| 3,970,960 | 7/1976 | Mallenauer | 372/42 |
| 4,124,690 | 11/1978 | Strong et al. | 423/446 |
| 4,174,380 | 11/1979 | Strong et al. | 423/446 |
| 4,518,659 | 5/1985 | Gigl et al. | 156/DIG. 68 |
| 4,638,484 | 1/1987 | Rand et al. | 372/42 |

FOREIGN PATENT DOCUMENTS

| | | | |
|---|---|---|---|
| 0014528 | 8/1980 | European Pat. Off. | 423/446 |
| 0136408 | 4/1985 | European Pat. Off. | 423/446 |
| 86/03347 | 6/1986 | PCT Int'l Appl. | 372/42 |

OTHER PUBLICATIONS

Rand, "Synthetic Diamond For Color Center Lasers", Topical Meeting on Tunable Solid State Laser, 2nd; 1986, cont. Zigtog, Osegen, pp. 138 to 140.

Collins et al., Luminescence Decay Time of the 1.945 V Centre In Type IO Diamond, J. Phys. C: Solid State Phys., 16(1983) 2177-2181.

Clark et al. Photoluminescence Associated with the 16731-944 and 2498 eV Centres In Diamond, J. Physc. C: Solid State Phys. 1971, vol. 14, pp. 2223-2229.

Primary Examiner—John Doll
Assistant Examiner—Robert M. Kunemund
Attorney, Agent, or Firm—Cushman, Darby & Cushman

[57] ABSTRACT

A light emitting element comprising diamond which contains N-V color centers in a maximum optical density of of 0.01 to 3.5 in a direction of excitation light, Ib type nitrogen atoms in a maximum optical density not larger than 0.2 in a wavelength range of 530 to 610 nm and optionally H3 color centers, which element can be efficiently produced from artificial diamond by a combination of irradiation by an electron beam or a neutron beam and annealing.

13 Claims, 5 Drawing Sheets

LIGHT EMITTING ELEMENT COMPRISING DIAMOND AND METHOD FOR PRODUCING THE SAME

BACKGROUND OF THE INVENTION

1. Field of the Invention

The present invention relates to a light emitting element comprising diamond and a method for producing the same. More particularly, it relates to a light emitting element comprising diamond containing N-V color centers and a method for producing the same from artificial diamond. The light emitting element comprising diamond is used as an element of a solid state laser which is tunable in a visible region.

2. Description of the Prior Arts

As a laser which is tunable in the visible region, a dye laser is known and used. But, the dye laser has several drawbacks. For example:

1. Since the dye is deteriorated by excitation light, output is unstable.
2. Since the dye is used in the form of a solution, a concentration of emission centers is low so that high output is not achieved.
3. Handling of the dye laser is troublesome.

Thus, it has been desired to provide a tunable solid state laser.

As a solid state laser, an alexandrite laser is known. This laser continuously emits light in a wavelength range of 701 to 826 nm (nanometers) at several ten watts, and finds applications such as processing or lithography. However, the alexandrite laser emits light having comparatively long wavelength.

Diamond is one of the most promising material for the solid state laser Possibility of application of diamond in a laser was described in Diamond Research, 1977, 11–14; Diamond Research, 1977, 15–23; Reports on Progress in Physics, 42, 1605–1659 (1979); and J. Phys. C: Solid. 16 (1983) 5417–5425.

The pure diamond has a large band gap of 5.5 eV. If it does not contain any impurity, it does not absorb or emit any light up to ultraviolet wavelength range. Therefore, color centers are to be created in the diamond crystal. To create the color centers in the diamond, the nitrogen atoms contained in the diamond are converted to one or more of following four types:

1. Ib type (discrete dispersion type)
2. IaA type (two nitrogen atoms aggregate)
3. IaB type (four nitrogen atoms aggregate)
4. Accumulated type When each of these type nitrogen atom is combined with a vacancy, the following color center is created:

1. N-V color center (Ib type nitrogen-vacancy) (wavelength of emitted light: 638–780 nm)
2. H3 color center (IaA type nitrogen-vacancy) (wavelength of emitted light: 503–600 nm)
3. H4 color center (IaB type nitrogen-vacancy) (wavelength of emitted light: 494–580)

The number of kinds of the color centers which can be created in the diamond may be about 60 in addition to the above three.

The application of color center in the laser was first reported by Dr. Stephen C. Rand in Optic Letters, 10 (1985) 481–483, in which pulse emission at 530 nm by using H3 centers was reported. However, laser emission by N-V centers has not been reported.

As described above, the N-V center is formed by combining the Ib type nitrogen atom with the vacancy (lattice defect). The N-V center absorbs excitation light in a wavelength range of 500 to 638 nm and emits luminescence in a wavelength range of 638 to 780 nm.

To form the N-V center in the diamond, a rough diamond containing Ib type nitrogen atoms is irradiated by an electron beam or a neutron beam to generate lattice defects. Then, the irradiated diamond is annealed by heating in vacuo to combine the lattice defect with the nitrogen atom to form the N-V center. The laser emission by the N-V centers is discussed in "Artificial Diamond for Color Center Laser", Solid State Lasers (Springer-Verlag) (1986). In this literature, the laser emission due to the N-V centers is said to be disadvantageous because of presence of quasistable level.

The solid state laser using diamond has still some disadvantages. For example, when natural diamond is used, a concentration of nitrogen atoms which contribute to the formation of color centers greatly varies from part to part, so that it is difficult to produce light emitting elements having the same quality. Since the natural diamond contains nitrogen atoms in three states, namely a IaA type, a IaB type and a discrete dispersion type, different color centers are formed corresponding to these states so that the element contains plural kinds of color centers, which results in unsatisfactory emission. When artificial Ib diamond produced by the thin film growing method is used, a relaxation time is short and intensity of emitted light is weak.

SUMMARY OF THE PRESENT INVENTION

One object of the present invention is to provide a light emitting element comprising diamond containing N-V color centers, which has not been realized by the prior art techniques.

Another object of the present invention is to provide a method for producing a light emitting element which comprises diamond containing N-V color centers with homogeneous distribution and which can emit light more efficiently than the conventional solid state laser elements.

According to one aspect of the present invention, there is provided a light emitting element comprising diamond in which a maximum optical density of N-V color centers in a direction of excitation light is in a range of 0.01 to 3 and a maximum optical density of Ib type nitrogen atoms in a wavelength range of 530 to 610 nm is not larger than 0.2.

According to another aspect of the present invention, there is provided a method for producing a light emitting element comprising diamond having N-V color centers, which comprises irradiating artificial diamond containing nitrogen atoms in a concentration of $1 \times 10^{17}$ to $2 \times 10^{20}$ atoms/cm$^3$ by an electron beam or a neutron beam and annealing the irradiated diamond at a temperature of 500° to 1,500° C. under pressure of not higher than 1 Torr.

DETAILED DESCRIPTION OF THE INVENTION

To emit laser beam by the N-V centers in the diamond, following requirements should be satisfied:

1. The maximum optical density of N-V centers in the diamond is from 0.01 to 3 in the direction of excitation light.
2. In a UV-visible wavelength range of 530 to 610 nm, the maximum optical density of Ib type nitrogen atoms is from 0 to 0.2.

To more effectively emit laser beam, the diamond further contains H3 color centers.

Figure 1:
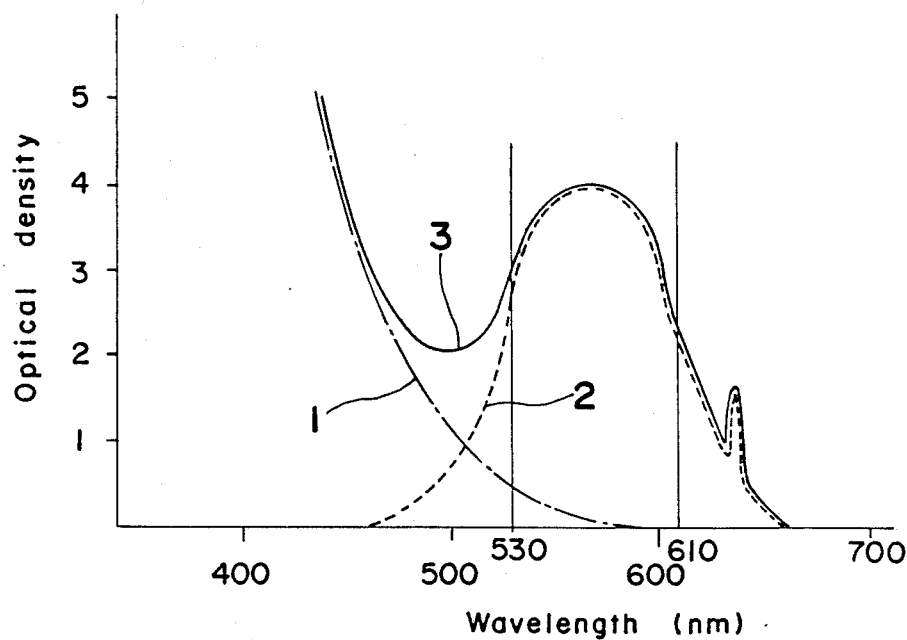
FIG. 1 shows a typical change in optical density of a conventional light emitting element.

In this specification, the optical density is defined by the following equation:

$$\text{Optical density} = \ln(I_0/I)$$

in which $I_0$ is an intensity of incident light and I is an intensity of transmitted light. If the light is not absorbed, I is equal to $I_0$. The absolute value of optical density varies with a thickness of a crystal through which light propagates. A typical change in optical density of a conventional light emitting element against wavelength of excitation light is shown in FIG. 1. The conventional element was produced by irradiating a natural or artificial Ib type diamond containing at least $2 \times 10^{14}$ atoms/cm$^3$ (about 110 ppm) of nitrogen atoms by an electron beam at an acceleration energy of 1 to 5 MeV for a dosage of $10^{16}$ to $10^{19}$ electrons/cm$^2$ followed by heating at a temperature of 600° to 1,200° C. in vacuo for 4 hours.

Figure 2:
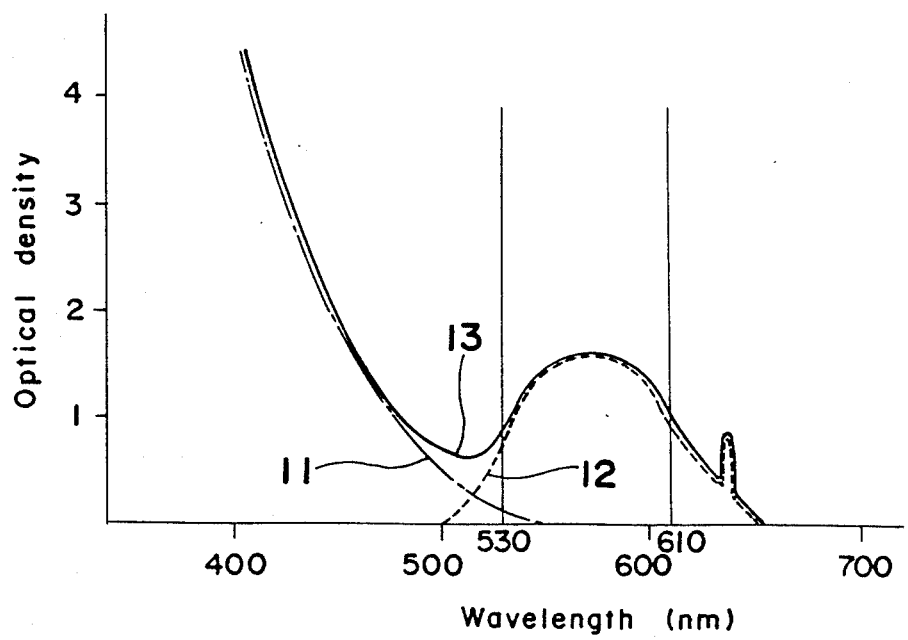
FIG. 2 shows a typical change in optical density of the light transmission element of the present invention which satisfies the optical densities of N-V color centers and Ib type nitrogen atoms.
Figure 3:
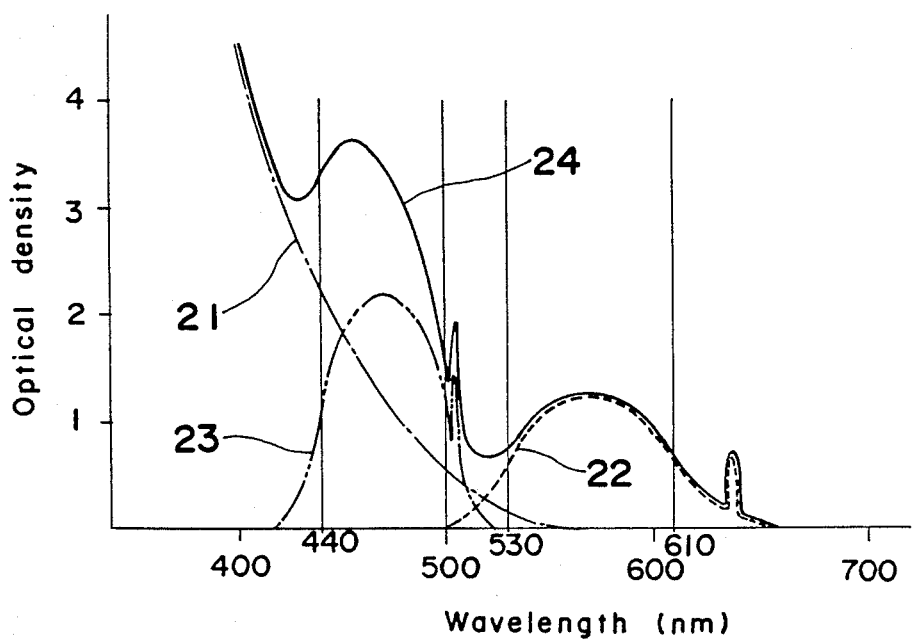
FIG. 3 shows a typical change in optical density of the light transmission element of the present invention which contains both the N-V and H3 color centers.

FIG. 2 shows a typical change in optical density of the light transmission element of the present invention which satisfies the optical densities of N-V color centers and Ib type nitrogen atoms. FIG. 3 shows a typical change in optical density of the light transmission element of the present invention which further contains H3 color centers.

In FIGS. 1, 2 and 3, the chain lines 1, 11 and 21 represent the changes of optical density of the N-V optical centers, the broken lines 2, 12 and 22 represent the changes of optical density of the Ib type nitrogen atoms, the chain line 23 represents the change of optical density of the H3 color centers, and the solid lines 3, 13 and 24 represent the total changes of optical densities.

OPTICAL DENSITY OF N-V COLOR CENTERS

Figure 4:
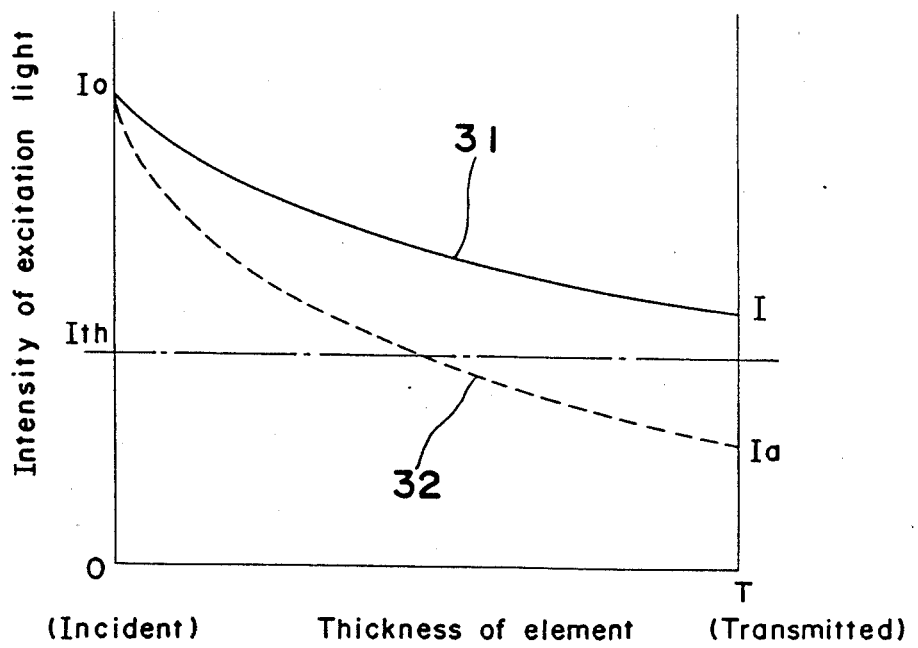
FIG. 4 shows a relationship between intensity of excitation light and a thickness of the light emitting element made of diamond.

FIG. 4 shows a distribution of intensity of excitation light which is impinged in the element having a thickness T at an intensity $I_0$. In FIG. 4, the solid line 31 represents a case in which the optical density of N-V color centers is in the range of 0.01 to 3.5, preferably 0.01 to 3, and the broken line 32 represent a case in which the optical density is larger than 3.5. I and $I_a$ represent the intensities of transmitted light. $I_{th}$ represents the threshold value required for emitting laser beam when a conventional resonator is used.

As is clear from FIG. 4, to achieve the excitation light distribution larger than $I_{th}$, the lower optical density is preferred. If the optical density is too large, the intensity is lower than $I_{th}$ in some areas in the crystal. Therefore, the laser is not emitted on a transmitted side from said areas. In order to emit the laser from any point of the crystal, the excitation light has the intensity larger than $I_{th}$. To this end, the optical density should be not larger than 3.5. On the other hand, the low optical density means decrease of the concentration of color center. If the concentration of color center is too low, self-excited emission is not caused so that no laser beam is emitted. That is, if the optical density of N-V optical center is less than 0.01, no laser beam is emitted.

OPTICAL DENSITY OF Ib TYPE NITROGEN ATOMS

On one hand, as shown in FIGS. 1, 2 and 3, the absorption by the Ib type nitrogen atoms (the chain lines 1, 11 and 21) and that by the N-V centers (the broken lines 2, 12 and 22) overlap with each other in a certain wavelength range. On the other hand, the laser beam is effectively emitted in an excitation light wavelength range of 530 to 610 nm. If the Ib type nitrogen atoms absorb light in this range, the excitation light is partially absorbed by the Ib nitrogen atoms and excitation effect decreases. To emit the laser beam the maximum optical density of the Ib type nitrogen atoms is from 0 to 0.2.

H3 COLOR CENTERS

When the absorption by the H3 color centers is added to the absorption by the N-V color centers as shown in FIG. 3, the excitation light having a wavelength of 440 to 500 nm can contribute to the laser beam emission. As seen from FIG. 2, mainly the excitation light having a wavelength of 530 to 600 nm contributes to the laser beam emission. When the H3 color centers are present in the diamond, energy transition from the H3 color centers to the N-V center occurs. The increase due to this energy transition is added to the original absorption of excitation light in the wavelength range of 530 to 610 nm by the N-V center. As the result, the intensity of the laser beam is intensified. The optical density of the H3 color centers is preferably from 0.1 to 4.

In the present invention, preferably the diamond containing nickel or aluminum may have emission relaxation time of not shorter than 17 nsec. The longer the relaxation time, the easier the emission of laser beam. Among the artificial diamond, a large single crystal diamond produced by a temperature gradient method may have longer relaxation time than a small single crystal diamond produced by a thin film growing method. Since all the nitrogen atoms contained in the artificial diamond are of Ib type, the optical density of N-V color center is easily controlled. Further, the artificial diamond produced by the temperature gradient method contains less bulky impurities.

According to the present invention, the light emitting element comprising the diamond may be prepared by irradiating artificial diamond containing nitrogen atoms in a concentration of $1 \times 10^{17}$ to $1 \times 10^{19}$ atoms/cm$^3$ by an electron beam or a neutron beam and annealing the irradiated diamond at a temperature of 500° to 1,500° C. under pressure of not higher than 1 Torr.

Irradiation can be made by an electron beam or a neutron beam. When the electron beam is used, it is irradiated at an acceleration energy of 2 to 4 MeV for a dosage of $1 \times 10^{17}$ to $2 \times 10^{18}$ electrons/cm$^2$, preferably not larger than $1 \times 10^{18}$ electrons/cm$^2$. When the neutron beam is used, - it is irradiated for a dosage of $1\times10^{15}$ to $1\times10^{18}$ neutrons/cm$^2$. By the irradiation, vacancies are created in the crystal lattice of the diamond.

When the dosage of electron beam is less than $1\times10^{17}$ electrons/cm$^2$, many unbound nitrogen atoms tend to remain in the diamond. When the dosage of electron beam is larger than $2\times10^{18}$ electrons/cm$^2$, too many vacancies are formed and excess vacancies tend to remain unbound.

When the dosage of neutron beam is less than $1\times10^{15}$ neutrons/cm$^2$, the concentration of color centers is insufficient and the laser beam is not emitted. When the dosage of neutron beam is larger than $1\times10^{18}$ neutrons/cm$^2$, the crystal lattice of diamond is vigorously damaged and light is intensively absorbed in a visible light range so that no laser beam is emitted. The neutron beam is particularly preferred, when the thickness of diamond is larger.

Figure 5:
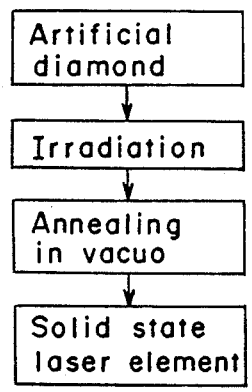
FIGS. 5 and 6 show steps of the methods for producing the light emitting element according to the present invention, and FIGS. 7, 8 and 9 schematically show apparatuses for exciting the light emitting element to emit laser beam.

After irradiation, the diamond is annealed at a temperature of 500° to 1,500° C., preferably 600° to 1,200° C., more preferably 600° to 1,000° C., preferably for at least 5 hours, whereby the vacancies are migrated to the nitrogen atoms to form the N-V color centers in the diamond crystal. These steps are shown in FIG. 5. At a temperature lower than 500° C., few N-V color centers are created. At a temperature higher than 1,500° C., the created N-V color centers are broken.

The annealing should be carried out in vacuo, preferably under pressure of not higher than 1 Torr. Under higher pressure, the surface of diamond is converted to graphite.

By selecting the concentration of nitrogen atom in the rough diamond and the irradiation and/or annealing conditions, the concentration or optical density of N-V color centers can be adjusted. Among these conditions, the nitrogen atom concentration has the most significant influence on the optical density of N-V color centers. If the nitrogen atom concentration in the diamond is less than $1\times10^{17}$ atoms/cm$^3$, any variation of the irradiation or annealing conditions cannot create the N-V color center at an optical density of 0.01 or larger. If the nitrogen atom concentration is larger than $1\times10^{19}$ atoms/cm$^3$, the irradiation dose should be made smaller to adjust the number of vacancies, whereby the optical density of N-V color centers is adjusted in the predetermined range. However, when the nitrogen atom concentration is so large, a number of free nitrogen atoms, namely the nitrogen atoms which are not bound with the vacancies, remain in the diamond crystal. The free nitrogen atoms absorb light in the wavelength range of 530 to 610 nm, and the optical density exceeds 0.2. If the sufficient number of vacancies are formed and the N-V color centers are created in a desired concentration by selecting the annealing conditions, many unbound nitrogen atoms and vacancies still remain and cause the same defect as above. In such case, GR1 centers consisting of the unbound vacancies further absorb light and have adverse affect on the laser beam emission.

According to the above method according to the present invention, since the nitrogen atom concentration in the rough diamond is selected from the above range, an preferable optical density is obtained and the above adverse effect is not found.

Figure 6:
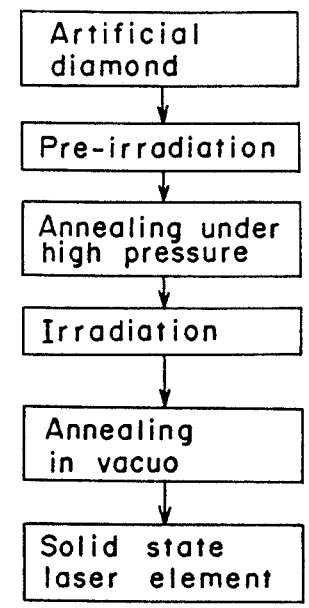

To create the H3 color centers, the diamond which is pre-irradiated under the same conditions as above and is annealed at a temperature of not lower than 1,700° C. and usually not higher than 2,500° C. under pressure of not lower than 3.0 GPa, preferably for at least 20 hours. In this annealing step for the creation of H3 color centers, higher pressure is preferred. However, when a pressure vessel made of a general industrial material such as cemented carbide, the maximum pressure is 6 GPa. For a pressure higher than 6 GPa, pressure vessel made of an expensive special material should be used. Then, the diamond is again irradiated and annealed under the same conditions employed for creating the N-V color centers. These steps are shown in FIG. 6.

By the pre-irradiation and the annealing under high pressure, some of the Ib type nitrogen atoms are converted to IaA type nitrogen atoms. A percentage of the nitrogen atoms to be converted depends on the conditions in the pre-irradiation and/or for the annealing under high pressure. These steps are known from B. P. Allen and T. Evans, Proceeding of the Royal Society of London (A) 375 (1981) 93-104.

After the pre-irradiation and annealing, the diamond contains both the unconverted Ib type nitrogen atoms and the IaA type nitrogen atoms which are converted from the Ib type nitrogen atoms. Then, the diamond is subjected to the second irradiation and annealing. Thereby, the vacancies are combined with both types of nitrogen atoms. The combination of the Ib type nitrogen atom and the vacancy creates the N-V color center as described above, and the combination of the IaA type nitrogen atom and the vacancy creates the H3 color center. The creation of H3 color centers by such method has not been reported, although its possibility was reported by S. C. Rand in "Artificial Diamond for Color Center Laser", Solid State Lasers, Springer Verlag, 1986. No practical method for producing the light emitting element comprising diamond which has the N-V color centers was not proposed by S. C. Rand.

The light emitting element comprising the diamond produced by the second method has following advantages:

1. Since a part of the Ib type nitrogen atoms are converted to the IaA type nitrogen atoms, the residual amount of the Ib type nitrogen atoms is controlled, and in turn, the optical density of N-V color center is controlled. Thereby, the light emitting element having the optimum optical density is produced.

2. By the decrease of the number of Ib type nitrogen atoms, the optical density of Ib type nitrogen atoms in the wavelength range of 530 to 610 nm is decreased.

3. By the creation of H3 color centers which coexist with the Ib type nitrogen atoms in the diamond, absorption efficiency of excitation light is increased.

Preferably, the rough diamond to be used in the second method contains nitrogen atoms in a concentration of $5\times10^{17}$ to $2\times10^{20}$ atoms/cm$^3$. When the concentration of the nitrogen atoms is less than $5\times10^{17}$ atoms/cm$^3$, the conversion rate from the Ib type nitrogen atoms to the IaA type nitrogen atoms is low so that the H3 color centers are not efficiently created. Even when the H3 color centers are created, their optical density is low and absorption efficiency of excitation light is low. When the concentration of the nitrogen atoms is higher than $2\times10^{20}$ atoms/cm$^3$, the absolute number of unconverted Ib type nitrogen atoms is large so that it is difficult to decrease the optical density of N-V color center to less than 3.

The first annealing is carried out at high temperature of not lower than 1,700° C. and under very high pressure of not lower than 3.0 GPa. When the pressure is lower than 3.0 GPa, the diamond is converted to graphite. When the temperature is lower than 1,700° C., the Ib type nitrogen atoms are very slowly converted to the IaA type nitrogen atoms. Preferably the first annealing is carried out under the above temperature and pressure conditions for at least 20 hours to sufficiently convert the Ib type nitrogen atoms to the IaA type nitrogen atoms.

The second irradiation and the second annealing are carried out under the same conditions as employed in the creation of the N-V color centers.

In the present invention, to widen the wavelength range of the emitted laser beam, the diamond crystal to be used according to the present invention may further contains metal elements such as nickel and aluminum to increase the wavelength range of the emitted laser beam. For example, when nickel is contained, the emitted laser beam wavelength is from 620 to 1,000 nm, while when nickel is not contained, the laser beam wavelength is from 650 to 780 nm. The effective concentration of the metal element is from $1 \times 10^{17}$ to $3.5 \times 10^{18}$ atoms/cm$^3$.

When the metal element such as nickel, iron, cobalt, manganese, chromium, aluminum, molybdenum, titanium, vanadium and hafnium is activated by irradiation, particularly by neutron beam irradiation, it is necessary to have a decay period for the activated element (cf. J. P. F. Sellschop, Diamond Research 1974, 43). However, when the concentration of metal element is not larger than $5 \times 10^{18}$ atoms/cm$^3$, the irradiated diamond can be safely handled.

PREFERRED EMBODIMENTS OF THE INVENTION

The present invention will be illustrated by following Examples.

EXAMPLE 1

Each of seven pieces of artificial diamond of 1.2 to 1.5 carats produced by the temperature gradient method containing $5 \times 10^{16}$ to $2 \times 10^{19}$ atoms/cm$^3$ of nitrogen atoms was processed in a rectangular parallelopiped. A thickness of the diamond in the direction of excitation light was 2 to 3 mm.

The processed diamond was irradiated by electron beam of 3 MeV for a dosage of $10^{18}$ electrons/cm$^2$ and then annealed at 900° C. under $10^{-3}$ Torr for 1 to 15 hours.

An optical density of the annealed diamond was analyzed by a UV-visible light spectroscopic analyzer.

Figure 7:
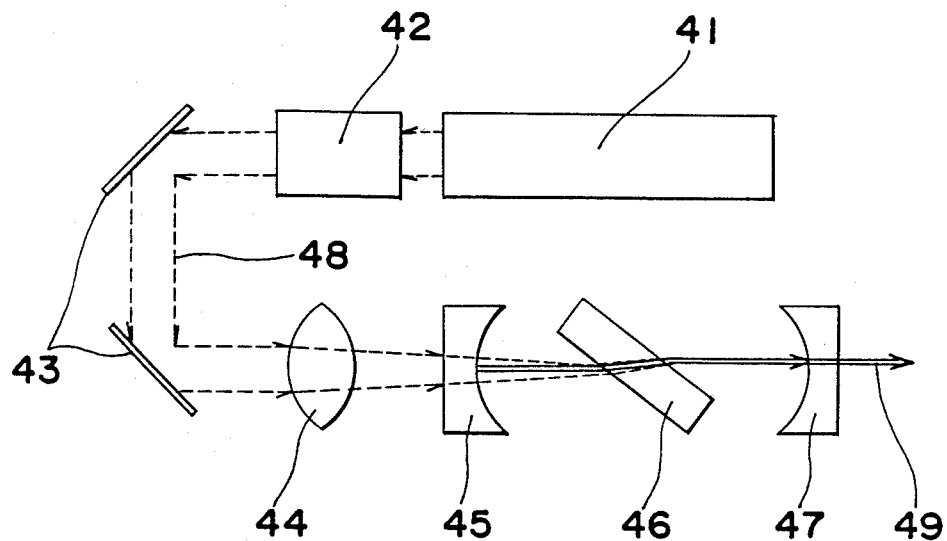

Then, the diamond was set in a resonator for laser beam emission as shown in FIG. 7, in which 41 stands for an Ar+ laser, 42 stands for a dye laser which converts the Ar+ laser to a continuous laser beam of a wavelength of 530 to 610 nm for exciting the N-V color centers, 43 stands for a total reflection mirror for changing light path, 44 stands for a condenser lens, 45 stands for a total reflection mirror, 46 stands for a sample diamond, 47 stands for a semi-transparent mirror, 48 stands for excitation light and 49 stands for emitted laser beam. The concentration of Ib type nitrogen atoms in the diamond crystal was estimated from an absorbancy index at 1,130 cm$^{-1}$ measured by an IR spectroscopic analyzer. The results are shown in Table 1, in which Sample Nos. 1, 2, 6 and 7 are for comparison.

TABLE 1

| Sample No. | Optical density of N-V color center | Optical density of Ib N atoms | Concentration of N atoms in rough diamond (atoms/cm$^3$) | Annealing time (hrs) | Laser emission |
|---|---|---|---|---|---|
| 1 | <0.005 | about 0 | $5 \times 10^{16}$ | 10 | No |
| 2 | <0.005 | about 0 | $1 \times 10^{17}$ | 1 | No |
| 3 | 0.01 | about 0 | $1 \times 10^{17}$ | 5 | Yes |
| 4 | 0.4 | 0.05 | $2 \times 10^{18}$ | 15 | Yes |
| 5 | 3 | 0.2 | $5 \times 10^{18}$ | 5 | Yes |
| 6 | 1.5 | 0.3 | $5 \times 10^{18}$ | 1 | No |
| 7 | 5 | 0.2 | $2 \times 10^{19}$ | 10 | No |
| 8 | 3.5 | 0.2 | $1 \times 10^{19}$ | 10 | Yes*1 |

Note:
*1 Although the laser beam was emitted, the threshold energy was very high and the sample become very hot.

EXAMPLE 2

Each of five pieces of artificial Ib type diamond of 1.2 to 1.5 carats produced by the temperature gradient method containing $5 \times 10^{17}$ to $9 \times 10^{20}$ atoms/cm$^3$ in nitrogen atoms was processed in a rectangular parallelopiped. A thickness of the diamond in the direction of excitation light was 2 to 3 mm.

To convert a part of the Ib type nitrogen atoms to the IaA type nitrogen atoms, the processed diamond was irradiated by electron beam of 2 MeV for a dosage of $10^{18}$ electrons/cm$^2$ and annealed at 2,000° C. under 3.0 GPa for 30 hours. Then, the diamond was again irradiated by electron beam of 3 MeV for a dosage of $10^{18}$ electrons/cm$^2$ and annealed at 850° C. under $10^{-3}$ Torr for 5 hours to create the N-V and H3 color centers.

Figure 8:
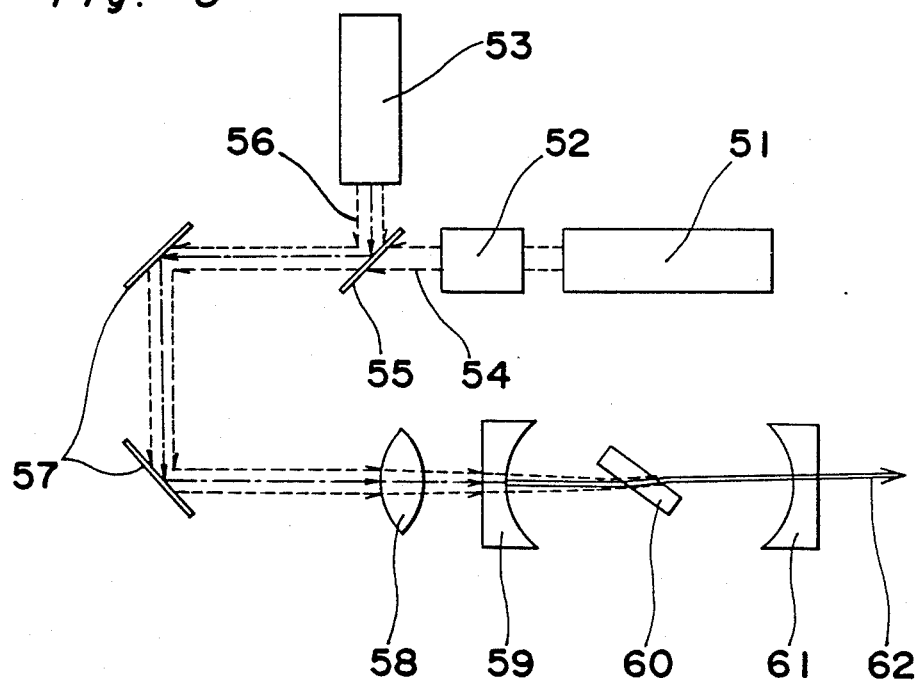

Each of the samples produced in Example 2 and the sample No. 4 produced in Example 1 was set in a resonator for laser emission having two excitation light sources as shown in FIG. 8, in which 51 stands for an Ar+ laser, 52 stands for a dye laser for exciting the N-V color centers, 53 stands for another Ar+ laser for exciting the H3 color centers, 54 and 56 stand for beams of excitation light, 55 stands for a band path mirror, 57 stands for a total reflection mirror for changing light path, 58 stands for a condenser lens, 59 stands for a total reflection mirror, 60 stands for a sample diamond, 61 stands for a semi-transparent mirror, and 62 stands for emitted laser beam. The total reflection mirror 59 and the semi-transparent mirror 61 constitute the resonator. Each optical density and the presence or absence of H3 color center were examined by the same methods as in Example 1. The results are shown in Table 2, in which the sample Nos. 11 and 15 are for comparison. The intensity of laser beam for the sample Nos. 11 to 15 was expressed as a relative value with using that of the sample No. 4 as the standard. The intensity of the laser beam was measured by an optical power meter. The intensity 0 (zero) means that no laser beam was emitted.

TABLE 2

| Sample No. | Optical density of N-V optical centers | Optical density of Ib N atoms (530-600 nm) | Presence of H3 color centers | N atoms in rough diamond (atoms/cm$^3$) | Intensity of laser beam |
|---|---|---|---|---|---|
| 4 | 0.4 | 0.05 | No | $2 \times 10^{18}$ | 1 |
| 11 | 0.005 | about 0 | Few | $1 \times 10^{17}$ | 0 |
| 12 | 0.01 | about 0 | A few | $5 \times 10^{17}$ | 1.1 |
| 13 | 0.4 | 0.05 | Yes | $9 \times 10^{18}$ | 1.6 |
| 14 | 3 | 0.2 | Yes | $2 \times 10^{20}$ | 1.4 |

TABLE 2-continued

| Sample No. | Optical density of N-V optical centers | Optical density of Ib N atoms (530-600 nm) | Presence of H3 color centers | N atoms in rough diamond (atoms/cm³) | Intensity of laser beam |
| --- | --- | --- | --- | --- | --- |
| 15 | 4 | 0.3 | Yes | $5 \times 10^{20}$ | 0 |

EXAMPLE 3

An artificial Ib type diamond crystal of 3 carats produced by the temperature gradient method containing $5 \times 10^{19}$ atoms/cm³ of nitrogen atoms was processed in a rectangular parallelopiped (7 mm×2 mm×5 mm).

To convert a part of the Ib type nitrogen atoms to the IaA type nitrogen atoms, the processed diamond was irradiated by electron beam of 2 MeV for a dosage of $10^{18}$ electrons/cm² and annealed at 2,000° C. under 3.0 GPa for 30 hours. Then, the diamond was again irradiated by electron beam of 2.0 MeV for a dosage of $10^{18}$ electrons/cm² and annealed at 850° C. under $10^{-3}$ Torr for 5 hours to create the N-V and H3 color centers.

The sample was set in the resonator of FIG. 8 with placing the 7 mm×2 mm plane in perpendicular to the direction of excitation light. By abrasion, the thickness of the sample was decreased step by step from 5 mm to 0.3 mm. The thickness of 0.3 mm is the possible minimum thickness. At each thickness, the same tests as in Example 2 were carried out. The results are shown in Table 3, in which the sample No. 21 is for comparison.

TABLE 3

| Sample No. | Thickness (mm) | Optical density of N-V color centers | Optical density of Ib type N atoms | Laser emission |
| --- | --- | --- | --- | --- |
| 21 | 5 | 4.2 | 0.13 | No |
| 22 | 3.6 | 3 | 0.09 | Yes |
| 23 | 2 | 1.7 | 0.05 | Yes |
| 24 | 0.3 | 0.25 | about 0 | Yes |

EXAMPLE 4

An artificial Ib type diamond crystal of 3.2 carats produced by the temperature gradient method containing $5 \times 10^{17}$ atoms/cm³ of nitrogen atoms was processed in a rectangular parallelopiped (7 mm×2 mm×5 mm).

The processed diamond was irradiated by electron beam of 2.0 MeV for a dosage of $10^{18}$ electrons/cm² and annealed at 850° C. under $10^{-3}$ Torr. for 10 hours to create the N-V centers.

The sample was set in the resonator of FIG. 8 with placing the 7 mm×2 mm plane in perpendicular to the direction of excitation light. By abrasion, the thickness of the sample was decreased step by step from 5 mm to 0.3 mm. At each thickness, the same tests as in Example 1 were carried out. The results are shown in Table 4, in which the sample No. 31 is for comparison.

TABLE 4

| Sample No. | Thickness (mm) | Optical density of N-V color centers | Optical density of Ib type N atoms | Laser emission |
| --- | --- | --- | --- | --- |
| 31 | 0.3 | <0.005 | about 0 | No |
| 32 | 0.5 | 0.01 | about 0 | Yes |
| 33 | 2 | 0.04 | 0.01 | Yes |

TABLE 4-continued

| Sample No. | Thickness (mm) | Optical density of N-V color centers | Optical density of Ib type N atoms | Laser emission |
| --- | --- | --- | --- | --- |
| 34 | 5 | 0.1 | 0.02 | Yes |

EXAMPLE 5

Each of five pieces of artificial Ib type diamond containing $5 \times 10^{18}$ atoms/cm³ of nitrogen atoms was processed in a cube (5 mm×5 mm×5 mm). The concentration of nitrogen atoms was measured by the same method as in Example 1. Contents of metal elements in the crystal were analyzed by a mass spectrometer. Nickel was contained at a concentration of $8 \times 10^{17}$ atoms/cm³.

Each diamond crystal was irradiated by neutron beam for a dosage shown in Table 5 and annealed at 900° C. under $10^{-2}$ Torr for 10 hours to create the N-V color centers. Then, it was excited by a dye laser shown in FIG. 9. A wavelength and intensity of the emitted laser beam was measured as follows:

An excitation light 77 was emitted from an excitation dye laser 76 and reflected by a band path mirror 75 so as to impinge light in the sample diamond 71 coated with films 72 which prevent surface loss. By resonating the sample diamond 71 in a cavity formed between a semi-transparent mirror 74 and a grating 73, laser beam 78 was emitted. By changing the angle of the grating 73, a wavelength of the emitted laser beam was changed. The intensity of emitted laser beam 78 was measured by introducing said light 68 in a power meter (not shown). The emitted wavelength was measured by a spectroscope.

The results are shown in Table 5, in which the sample Nos. 41 and 45 are for comparison. The intensity of laser beam for the sample Nos. 42 to 44 was expressed as a relative value with using that of the sample No. 43 as the standard.

Radiation dose of the diamond was measured by a Geiger tube but substantially no radiation was detected.

TABLE 5

| Sample No. | Neutron dosage (neutrons/cm²) | Wavelength of emitted laser beam (nm) | Intensity of emitted laser beam |
| --- | --- | --- | --- |
| 41 | $1 \times 10^{14}$ | No emission | |
| 42 | $1 \times 10^{15}$ | 660–760 | 0.7 |
| 43 | $1 \times 10^{16}$ | 650–780 | 1 |
| 44 | $1 \times 10^{18}$ | 650–780 | 0.9 |
| 45 | $1 \times 10^{19}$ | No emission | |

EXAMPLE 6

Two of four pieces of artificial Ib type diamond containing $2 \times 10^{18}$ atoms/cm³ of nitrogen atoms were processed in a plate form (each 5 mm×5 mm×3 mm) and other two were processed in a cube (5 mm×5 mm×5 mm).

One of the each sized diamond pieces was irradiated by electron beam of 3 MeV for a dosage of $1 \times 10^{18}$ electrons/cm², and the other of each sized diamond pieces was irradiated by neutron beam for a dosage of $2 \times 10^{16}$ neutrons/cm². Then, all pieces were annealed at 900° C. under $10^{-2}$ Torr for 10 hours to create the N-V color centers.

Although the diamond contained nickel in a concentration of $8 \times 10^{17}$ atoms/cm$^3$, radiation dose from the neutron irradiated samples was nearly zero by a Geiger tube.

Figure 9:
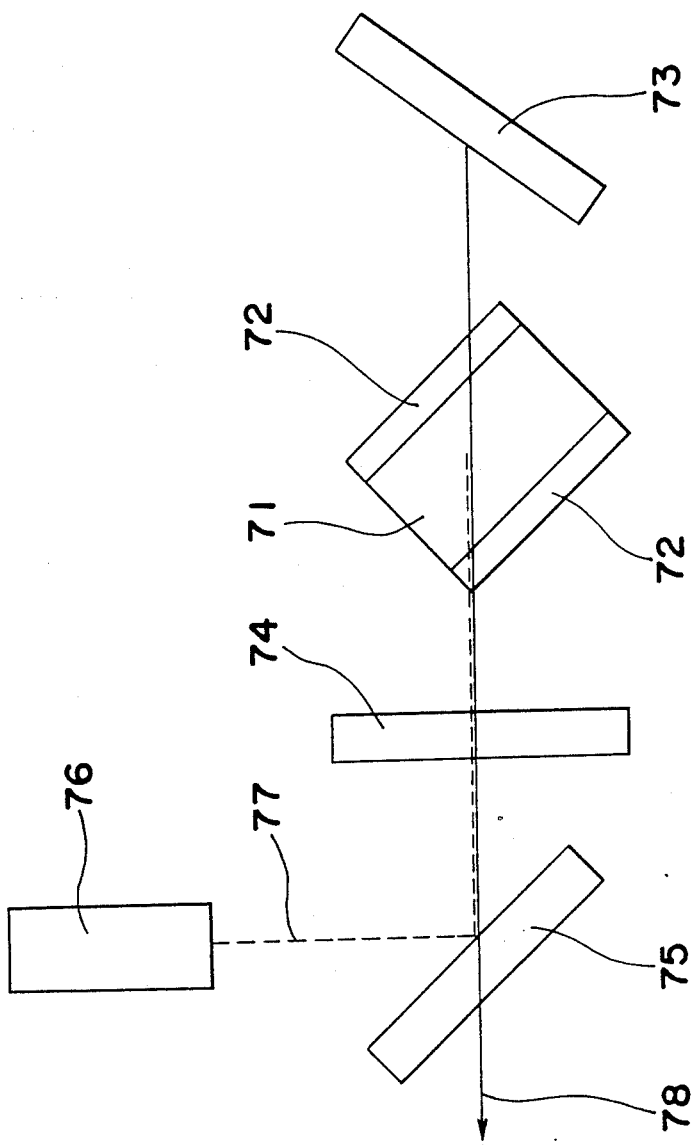

Then, each sample was excited by a dye laser with excitation light having a wavelength of 538 nm as shown in FIG. 9. The wavelength and intensity of the emitted laser beam were measured in the same manners as in Example 5. The results are shown in Table 6, in which the sample Nos. 52 and 54 are for comparison. The intensity of laser beam is expressed as a relative value with using that of the sample No. 73 as the standard.

TABLE 6

| Sample No. | Size (mm) (excited thickness)*1 | Neutron dosage (/cm$^2$) | Electron dosage (/cm$^2$) | Wavelength of laser beam (nm) | Intensity of laser beam |
|---|---|---|---|---|---|
| 51 | 5 × 5 × 3 (3) | 2 × 10$^{16}$ | — | 650–780 | 1 |
| 52 | 5 × 5 × 3 (3) | — | 1 × 10$^{18}$ | 680–750 | 0.2 |
| 53 | 5 × 5 × 5 (5) | 2 × 10$^{16}$ | — | 650–780 | 1 |
| 54 | 5 × 5 × 5 (5) | — | 1 × 10$^{18}$ | No emission | |

Note: *1Thickness perpendicular to the direction of excitation laser beam.

EXAMPLE 7

An artificial diamond produced by the temperature gradient method (sample A), an artificial diamond produced by the thin film growing method (sample B) and a natural diamond (sample C) were used.

Each diamond was irradiated by electron beam of 2 MeV for a dosage of $1 \times 10^{18}$ electrons/cm$^2$ and then annealed at 1,000° C. under 1 Torr. for 5 hours.

Then, each sample was excited by a dye (Rhodamine) laser with pulsed excitation light of a wavelength of 580 nm in a interval of 4 nsec as shown in FIG. 9. By synchronizing the pulse and luminescence, a relaxation time was measured. The intensity of luminescence was measured by using the Ar$^+$ laser as the excitation light and measuring the intensity spectrum of emitted laser beam with varying wavelength by using a photomultiplier which converts light intensity to electrical signals. The results are shown in Table 7, in which the intensity of luminescence is expressed as a relative value with using that of the sample A as the standard.

TABLE 7

| Sample No. | Concentration of N atoms (atoms/cm$^3$) | Type of N atoms | Relaxation time (nsec) | Intensity of luminescence |
|---|---|---|---|---|
| A | 5 × 10$^{18}$ | Discrete dispersion | 17 | 1 |
| B | 8 × 10$^{19}$ | Discrete dispersion | 13 | 0.1 |
| C | 8 × 10$^{18}$ | Discrete dispersion + A type | 16 | 0.3 |

EXAMPLE 8

Each of five pieces of artificial diamond containing $5 \times 10^{18}$ atoms/cm$^3$ of nitrogen atoms and nickel in a concentration shown in Table 10 produced by the temperature gradient method was irradiated by electron beam of 2 MeV for a dosage of $1 \times 10^{18}$ electrons/cm$^2$ and then annealed at 1,000° C. under 1 Torr. for 5 hours.

Then, each sample was excited by the dye laser with excitation light of a wavelength of 580 nm as shown in FIG. 9. The relaxation time was measured in the same manner as in Example 7. On exiting the sample by the dye laser, luminescence of the N-V color centers was emitted in a wavelength range shown in a range shown in Table 8. The results are shown in Table 8, in which the intensity of luminescence is expressed as a relative value with using that of the sample D as the standard.

TABLE 7

| Sample No. | Concentration of nickel atoms (atoms/cm$^3$) | Intensity of luminescence | Wavelength of luminescence (nm) |
|---|---|---|---|
| D | 5 × 10$^{16}$ | 1 | 640–840 |
| E | 1 × 10$^{17}$ | 1 | 640–1,000 |
| F | 2 × 10$^{18}$ | 1 | 640–1,000 |
| G | 5 × 10$^{18}$ | 1 | 640–1,000 |
| H | 1 × 10$^{19}$ | 0.5 | 640–1,000 |

What is claimed is:

1. A light emitting element comprising synthetic diamond wherein a maximum optical density of N-V color centers in a direction of excitation light is in a range of 0.01 to 3.5, a maximum optical density of Ib type nitrogen atoms in a wavelength range of 530 to 610 nm is not greater than 0.2 and in a concentration of $1 \times 10^{17}$ to $10^{19}$ atoms/cm$^3$.

2. The light emitting element according to claim 1, wherein the diamond contains the Ia and Ib type nitrogen atoms in a concentration of $5 \times 10^{17}$ to $2 \times 10^{20}$ atoms/cm$^2$ and further H3 color centers.

3. The light emitting element according to claim 2, wherein the H3 color centers are contained in an optical density of 0.1 to 4.

4. The light emitting element according to claim 1, wherein the diamond contains nickel or aluminum in a concentration of $1 \times 10^{17}$ to 3.5 to $10^{18}$ atoms/cm$^3$.

5. The light emitting element according to claim 1, wherein the diamond contains at least one metal element selected from the group consisting of nickel, iron, cobalt, manganese, chromium, aluminum, molybdenum, titanium, vanadium and hafnium in a total concentration of not more than $5 \times 10^{18}$ atoms/cm$^2$.

6. A method for producing a light emitting element comprising diamond having N-V color centers, which comprises irradiating artificial diamond containing nitrogen atoms in a concentration of $1 \times 10^{17}$ to $1 \times 10^{19}$ atoms/cm$^3$ by an electron beam or a neutron beam and annealing the irradiated diamond at a temperature of 500° to 1,500° C. under pressure of not higher than 1 Torr.

7. The method according to claim 6, wherein the diamond is irradiated by an electron beam of 2 to 4 MeV for a dosage of $1 \times 10^{17}$ to $1 \times 10^{18}$ electrons/cm$^2$.

8. The method according to claim 6, wherein the diamond is irradiated by neutron beam for a dosage of $1 \times 10^{15}$ to $1 \times 10^{18}$ neutrons/cm$^2$.

9. The method according to claim 8, wherein the diamond contains the nitrogen atoms in a concentration of $1 \times 10^{17}$ to $1 \times 10^{19}$ atoms/cm$^3$.

10. The method according to claim 6, wherein the annealing is carried out for at least 5 hours.

11. A method for producing a light emitting element comprising diamond having N-V color centers and H3 color centers which comprises pre-irradiating artifical diamond containing nitrogen atoms in a concentration of $5\times10^{17}$ to $2\times10^{20}$ atoms/cm$^3$ by an electron beam for a dosage of $10^{17}$ to $1\times10^{18}$ electrons/cm$^2$, annealing the pre-irradiated diamond at a temperature of not lower than 1,700° C. under pressure of not lower than 3.0 GPa, irradiating the pre-irradiated and annealed diamond by an electron beam or a neutron beam and annealing the irradiated diamond at a temperature of 500° to 1,500° C. under pressure of not higher than 1 Torr.

12. The method according to claim 11 wherein the pre-irradiated and annealed diamond is irradiated by electron beam of 2 to 4 MeV for a dosage of $1\times10^{17}$ to $1\times10^{20}$ electrons/cm$^2$.

13. The method according to claim 11, wherein the pre-irradiated and annealed diamond is irradiated by neutron beam for a dosage of $1\times10^{15}$ to $1\times10^{18}$ neutrons/cm$^2$.

* * * * *